(12) United States Patent
Ikeda et al.

(10) Patent No.: US 10,525,835 B2
(45) Date of Patent: Jan. 7, 2020

(54) POWER CONTROL APPARATUS AND POWER CONTROL SYSTEM

(71) Applicant: Kabushiki Kaisha Toshiba, Minato-ku (JP)

(72) Inventors: Sonoka Ikeda, Kanagawa (JP); Shinichiro Kosugi, Kanagawa (JP); Masahiro Sekino, Tokyo (JP); Kazuto Kuroda, Tokyo (JP); Osamu Yamazaki, Tokyo (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 291 days.

(21) Appl. No.: 15/455,962

(22) Filed: Mar. 10, 2017

(65) Prior Publication Data

US 2017/0182907 A1    Jun. 29, 2017

Related U.S. Application Data

(63) Continuation of application No. PCT/JP2015/083233, filed on Nov. 26, 2015.

(51) Int. Cl.
*G01R 31/396* (2019.01)
*B60L 11/18* (2006.01)
(Continued)

(52) U.S. Cl.
CPC ...... *B60L 11/1862* (2013.01); *G01R 31/3648* (2013.01); *H02J 7/0021* (2013.01)

(58) Field of Classification Search
CPC .. B60L 11/1862; B60L 11/02; B60L 11/1864; B60L 2200/26; B60L 2240/547; B60L 2240/549; B61B 1/00; G01R 31/3648; H02J 7/0021; H02J 7/1438; H02J 7/1492; Y02T 10/70; Y02T 10/7005;
(Continued)

(56) References Cited

U.S. PATENT DOCUMENTS

| 7,005,819 B2 | 2/2006 | Takai et al. |
| 10,069,311 B2 | 9/2018 | Sugeno et al. |

(Continued)

FOREIGN PATENT DOCUMENTS

| CN | 101443978 A | 5/2009 |
| DE | 10-2005-051317 A1 | 6/2006 |

(Continued)

OTHER PUBLICATIONS

Office Action dated Aug. 8, 2017 in Japanese Patent Application No. 2017-511806 with English translation, 12 pages.
(Continued)

*Primary Examiner* — Melissa J Koval
*Assistant Examiner* — Courtney G McDonnough
(74) *Attorney, Agent, or Firm* — Oblon, McClelland, Maier & Neustadt, L.L.P.

(57) ABSTRACT

A power control apparatus according to an embodiment includes acquisition circuitry and determination circuitry. The acquisition circuitry is configured to acquire a voltage of a secondary battery during charging. The determination circuitry is configured to determine a maximum current to be used during charging of the secondary battery using a difference between an upper limit voltage and the acquired voltage.

9 Claims, 16 Drawing Sheets

(51) Int. Cl.
*G01R 31/36* (2019.01)
*H02J 7/00* (2006.01)

(58) Field of Classification Search
CPC ............. Y02T 10/7044; Y02T 10/7061; Y02T 10/7077; Y02T 10/92
USPC ........................................................ 324/426
See application file for complete search history.

(56) References Cited

U.S. PATENT DOCUMENTS

| | | |
|---|---|---|
| 2005/0269983 A1 | 12/2005 | Takai et al. |
| 2006/0087291 A1 | 4/2006 | Yamauchi |
| 2007/0126404 A1 | 6/2007 | Iida et al. |
| 2009/0266631 A1* | 10/2009 | Kikuchi ................ H01M 10/44 180/65.265 |
| 2011/0109273 A1* | 5/2011 | Tamezane ............. H02J 7/0077 320/132 |
| 2013/0103333 A1 | 4/2013 | Nishida |
| 2014/0266068 A1 | 9/2014 | O'Brien et al. |

FOREIGN PATENT DOCUMENTS

| | | |
|---|---|---|
| JP | 2005-348580 A | 12/2005 |
| JP | 2007-306771 | 11/2007 |
| JP | 2010-41883 A | 2/2010 |
| JP | 2010-203885 A | 9/2010 |
| JP | 2011-103748 | 5/2011 |
| JP | 2011-135636 A | 7/2011 |
| JP | 2011-17701 A | 9/2011 |
| JP | 2011-177011 A | 9/2011 |
| JP | 2012-69451 A | 4/2012 |
| JP | 2012-249410 A | 12/2012 |
| JP | 2015-061335 A | 3/2015 |
| JP | 2015-177601 A | 10/2015 |
| WO | WO 2012/165071 A1 | 12/2012 |

OTHER PUBLICATIONS

Extended European Search Report dated Jul. 4, 2019, in European Patent Application No. 15 902 469.4.

* cited by examiner

POWER CONTROL APPARATUS AND POWER CONTROL SYSTEM

CROSS-REFERENCE TO RELATED APPLICATION

This application is a continuation application of International Application No. PCT/JP2015/083233, filed Nov. 26, 2015, which designates the United States and is incorporated herein by reference.

FIELD

Embodiments of the present invention relate to a power control apparatus and a power control system.

BACKGROUND

In recent years, the application of secondary batteries to hybrid applications with engines of locomotives, buses, construction machines, or the like or to power fluctuation suppression applications in stationary type industrial equipment has become active. In these applications, input and output of a large electric current, and a charging state range where energy can be used in a wide range are required. Conventionally, in order to use an energy capacity capable of being used for storage or traveling without waste, a technique for controlling an upper or lower limit of a charging state range where energy of a secondary battery can be used by specifying the limits using an electric capacity has been widely used. However, in situations where the charging state range is specified using the electric capacity and is set to a wide range, before reaching the upper or lower limit electric capacity, an upper or lower limit value of a closed-circuit voltage of the battery may arrive, so that the equipment may stop. That is, a usable energy range may be greatly limited. In this way, there may be situations where a voltage of a secondary battery cannot be accurately limited.

In order to solve the above-mentioned problem, an object of the invention is to provide a power control apparatus and a power control system capable of accurately limiting a voltage of a secondary battery.

SOLUTION TO PROBLEM

According to an embodiment, a power control apparatus includes an acquisition unit and a determination unit. The acquisition unit acquires information relating to a voltage of a chargeable/dischargeable secondary battery during charging. The determination unit determines a maximum current of the secondary battery during charging on the basis of the information acquired by the acquisition unit so that the maximum current tends to become smaller as a difference between an upper limit voltage and the voltage of the secondary battery becomes smaller and is limited by an upper limit current.

DETAILED DESCRIPTION

According to an embodiment, a power control apparatus and power control system is provided. The power control apparatus includes acquisition circuitry, determination circuitry. The acquisition circuitry is configured to acquire a voltage of a secondary battery during charging. The determination is circuitry configured to determine a maximum current to be used during charging of the secondary battery using a difference between an upper limit voltage and the acquired voltage.

Hereinafter, a power control apparatus and a power control system according to embodiments will be described with reference to the accompanying drawings.

(First Embodiment)

Figure 1:
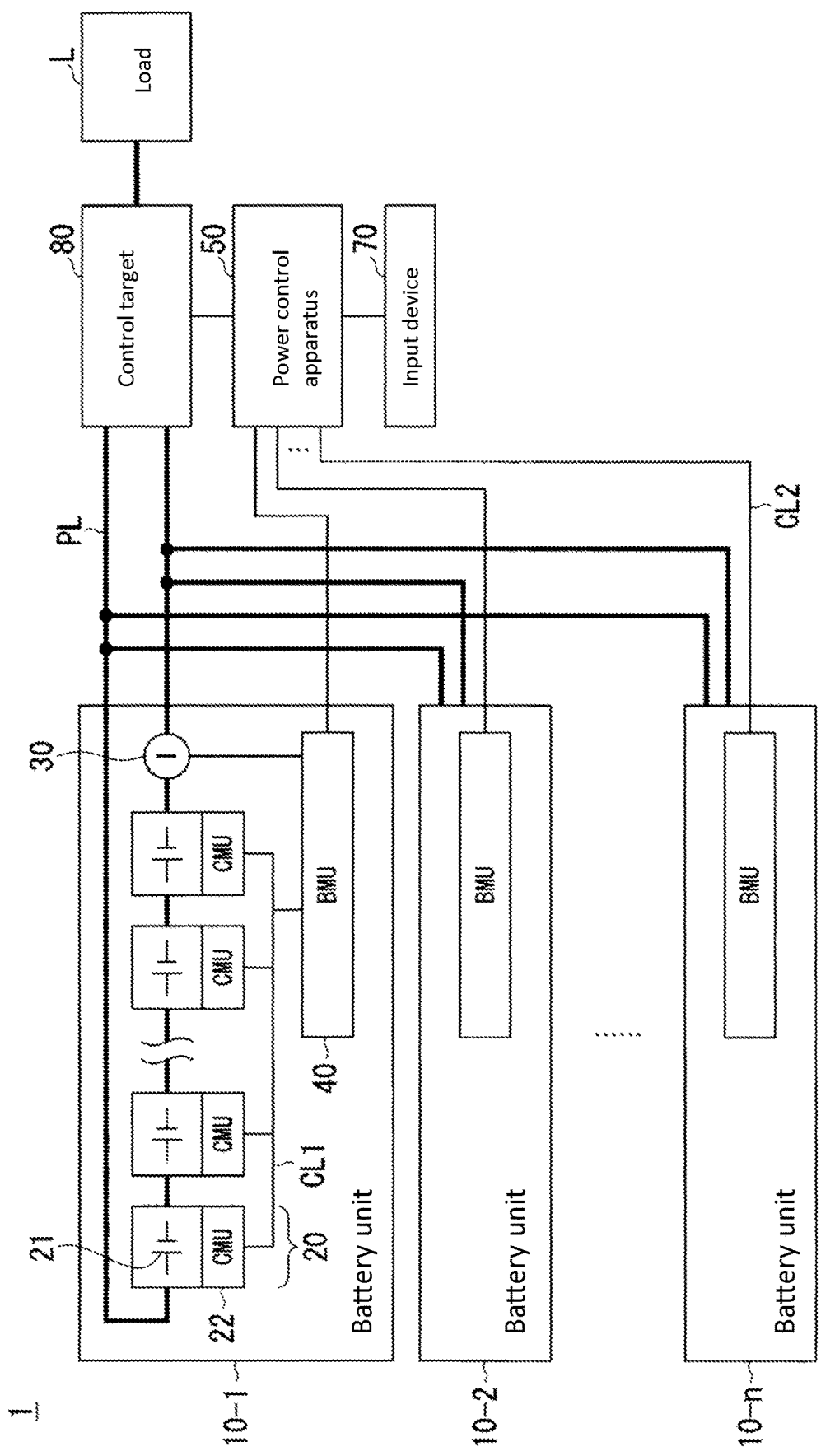
FIG. 1 is a diagram showing an exemplary configuration of a power control system 1.

FIG. 1 is a diagram showing an exemplary configuration of a power control system 1 according to a first embodiment. The power control system 1 may include battery units 10-1, 10-2, . . . , and 10-$n$ ($n$ is an arbitrary natural number), a power control apparatus 50, an input device 70, and a control target 80, but is not limited thereto. Hereinafter, when the battery units are not distinguished from each other, the battery units are simply denoted as the battery units 10.

The plurality of battery units 10 are connected to the control target 80 in parallel through power lines PL to supply power to the control target 80. Since the respective battery units 10 have the same configuration (which may be partially different from each other), in the figure, only a configuration of the battery unit 10-1 is shown in detail as a representative of the plurality of battery units. The battery unit 10 includes a plurality of battery modules 20 which are connected to each other in series, a current sensor 30, and a battery management unit (BMU) 40. The respective components in the battery unit 10 are connected to each other through an in-unit communication line CL1. In the in-unit communication line CL1, for example, communication based on a controller area network (CAN) is performed.

Figure 2:
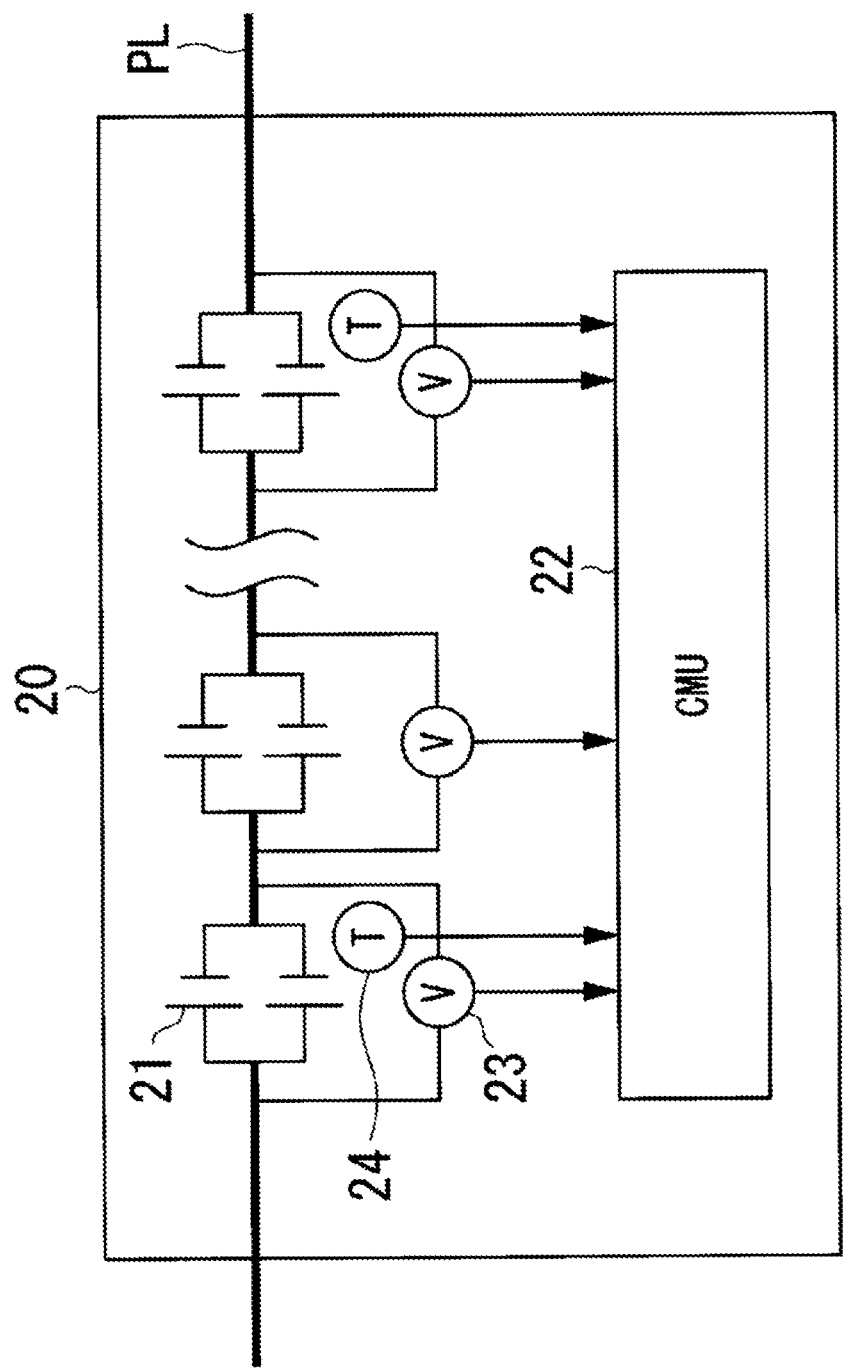
FIG. 2 is a diagram showing an exemplary configuration of a battery module 20.

FIG. 2 is a diagram showing an exemplary configuration of the battery module 20. The battery module 20 is an assembled battery (battery) in which a plurality of battery cells 21 are connected to each other. Further, each battery unit 10 and a result of the parallel connection of the battery units 10 also similarly form assembled batteries (batteries). In the battery module 20, for example, sets of two battery cells 21 which are connected to each other in parallel are connected to each other in series. This configuration is not limiting, and a connection form of the battery cells in the battery module 20 may be arbitrarily determined.

The battery cell 21 is a chargeable/dischargeable secondary battery such as a lithium ion battery, a lead storage battery, a sodium sulfur battery, a redox flow battery, or a nickel metal hydride battery. In the case of the lithium ion battery, the battery cell 21 may use lithium titanate as an anode material. In FIGS. 1 and 2, a configuration for charging the battery cell 21 is not shown.

The battery module 20 further includes a cell monitoring unit (CMU) 22, a plurality of voltage sensors 23, and a plurality of temperature sensors 24. The CMU 22 includes a processor such as a central processing unit (CPU), a variety of storage devices, a CAN controller, a communication interface, and the like.

Each voltage sensor 23 measures a voltage of the set of the battery cells 21 which are connected to each other in parallel, for example. In addition, the temperature sensors 24 are attached to arbitrary places in the battery module 20, and the number thereof is arbitrary. Detection results of the voltage sensors 23 and the temperature sensors 24 are output to the CMU 22. The CMU 22 outputs the detection results of the voltage sensors 23 and the temperature sensors 24 to the BMU 40.

Returning to FIG. 1, the BMU 40 is connected to the plurality of CMUs 22 through the in-unit communication line CL1, and is connected to the power control apparatus 50 through a communication line CL2. The BMU 40 includes a processor such as a CPU, a variety of storage devices, a CAN controller, a communication interface corresponding to the communication line CL2, and the like. Wireless communication may be performed between the BMU 40 and the power control apparatus 50 without using the communication line CL2. A detection result of the current sensor 30 that detects an electric current that flows in the battery module 20 of the battery unit 10 is input to the BMU 40.

The power control apparatus 50 includes a processor such as a CPU, a variety of storage devices, a communication interface corresponding to the communication line CL2, and the like. The power control apparatus 50 controls the control target 80 on the basis of information input from the plurality of BMUs 40 and operation information input from the input device 70.

Figure 3:
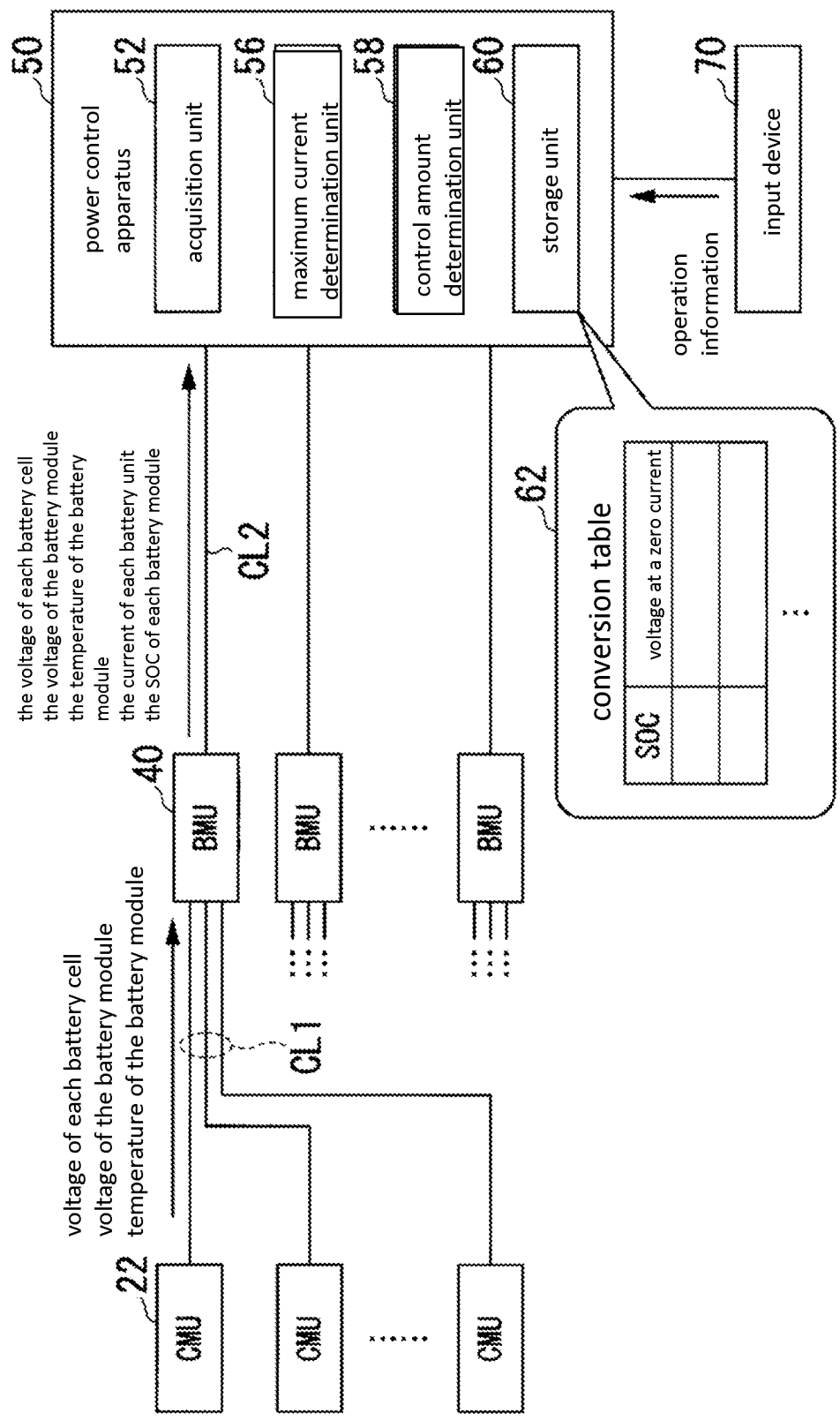
FIG. 3 is a diagram showing an exemplary configuration relating to control in the power control system 1.

FIG. 3 is a diagram showing an exemplary configuration relating to control in the power control system 1. Information on a voltage of each battery cell 21, a voltage of the battery module 20, a temperature of the battery module 20, and the like is provided to the BMU 40 from the CMU 22. The CMU 22 adds up the voltages of the respective battery cells 21 to calculate the voltage of the battery module 20. Instead, the BMU 40 may add up the voltages of the respective battery cells 21 to calculate the voltage of the battery module 20.

The BMU 40 calculates a state of charge (SOC) of each battery module 20 on the basis of a detection result of the current sensor 30 (see FIG. 1). The SOC of each battery module 20 (or an SOC of each battery cell 21) may be calculated by the CMU 22 on the basis of a detection result of the voltage sensor 23, for example. The BMU 40 outputs the information on the voltage of each battery cell 21, the voltage of the battery module 20, the temperature of the battery module 20 and the like, input from the CMU 22, and the calculated SOC to the power control apparatus 50.

The power control apparatus 50 includes a processor such as a CPU, a variety of storage devices, the communication lines CL2, a communication interface corresponding to communication with the control target 80, and the like. The power control apparatus 50 includes an acquisition unit 52, a maximum current determination unit 56, a control amount determination unit 58, and a storage unit 60, as functional components. One or both of the maximum current determination unit 56 and the control amount determination unit 58 are realized by executing a program stored in the storage unit 60 by a processor such as a CPU. Further, these functional units may be realized by hardware such as a large scale integration (LSI), an application specific integrated circuit (ASIC), or a field-programmable gate array (FPGA).

The acquisition unit 52 includes a communication interface, and outputs information acquired from the BMU 40 to the maximum current determination unit 56 or stores the information in the storage unit 60.

The maximum current determination unit 56 determines a maximum current of the battery cell 21 during charging or discharging on the basis of comparison of the voltage of the battery cell 21 obtained from the information acquired from the acquisition unit 52 and an upper limit voltage VcMAX or a lower limit voltage VcMIN. The upper limit voltage VcMAX or the lower limit voltage VcMIN is a value which is determined in advance from a viewpoint of suppressing deterioration of the battery cell 21. The upper limit voltage VcMAX is set in advance on the basis of a usable maximum voltage of the battery cell 21. It is preferable that the upper limit voltage VcMAX is set to a value lower than the usable maximum voltage of the battery cell 21 in consideration of a margin for control, but the upper limit voltage VcMAX may be set to be equal to the usable maximum voltage of the battery cell 21. Further, the lower limit voltage VcMIN is set in advance on the basis of a usable minimum voltage of the battery cell 21. It is preferable that the lower limit voltage VcMIN is set to a value higher than the usable minimum voltage of the battery cell 21 in consideration of a margin for control, but the lower limit voltage VcMIN may be set to be equal to the usable minimum voltage of the battery cell 21.

The control amount determination unit 58 determines a control amount to be given to the control target 80 on the basis of operation information input from the input device 70 and the maximum current determined by the maximum current determination unit 56. The input device 70 may include a lever switch, a dial switch, a variety of keys, a touch panel, or the like.

The control target 80 includes a plurality of transistors, and may include a DC-AC converter that converts a direct current to an alternating current by switching control of the transistors. In this case, the control amount to be given to the control target 80 refers to a duty ratio in switching control, for example. In addition, in a case where the control target 80 is a device for supplying power to a cage type induction motor, the control amount to be given to the control target 80 may include a command value such as an i-axis current or a q-axis current. Further, the control target 80 may include a power generator that generates power and supplies the power to the battery unit 10, a device that discards a part of power to be supplied to the power generator as heat (a device that limits electric power generation), or the like.

The function of the control amount determination unit 58 may be a function of a separate control apparatus from the power control apparatus 50. In this case, the power control apparatus 50 outputs the maximum current determined by the maximum current determination unit 56 to the separate control apparatus. Further, the input device 70 may be removed from the configuration shown in FIGS. 1 and 3, and the control amount determination unit 58 may determine the control amount to be given to the control target 80 on the basis of the maximum current determined by the maximum current determination unit 56, and other information.

The storage unit 60 is realized by a variety of storage devices such as a read only memory (ROM), a random access memory (RAM), a hard disk drive (HDD), a solid state drive (SSD), or other flash memory devices. In the storage unit 60, a program executed by the processor of the power control apparatus 50, a conversion table 62, and a variety of information generated in the course of processes of the maximum current determination unit 56 and the control amount determination unit 58 are stored.

Figure 4:
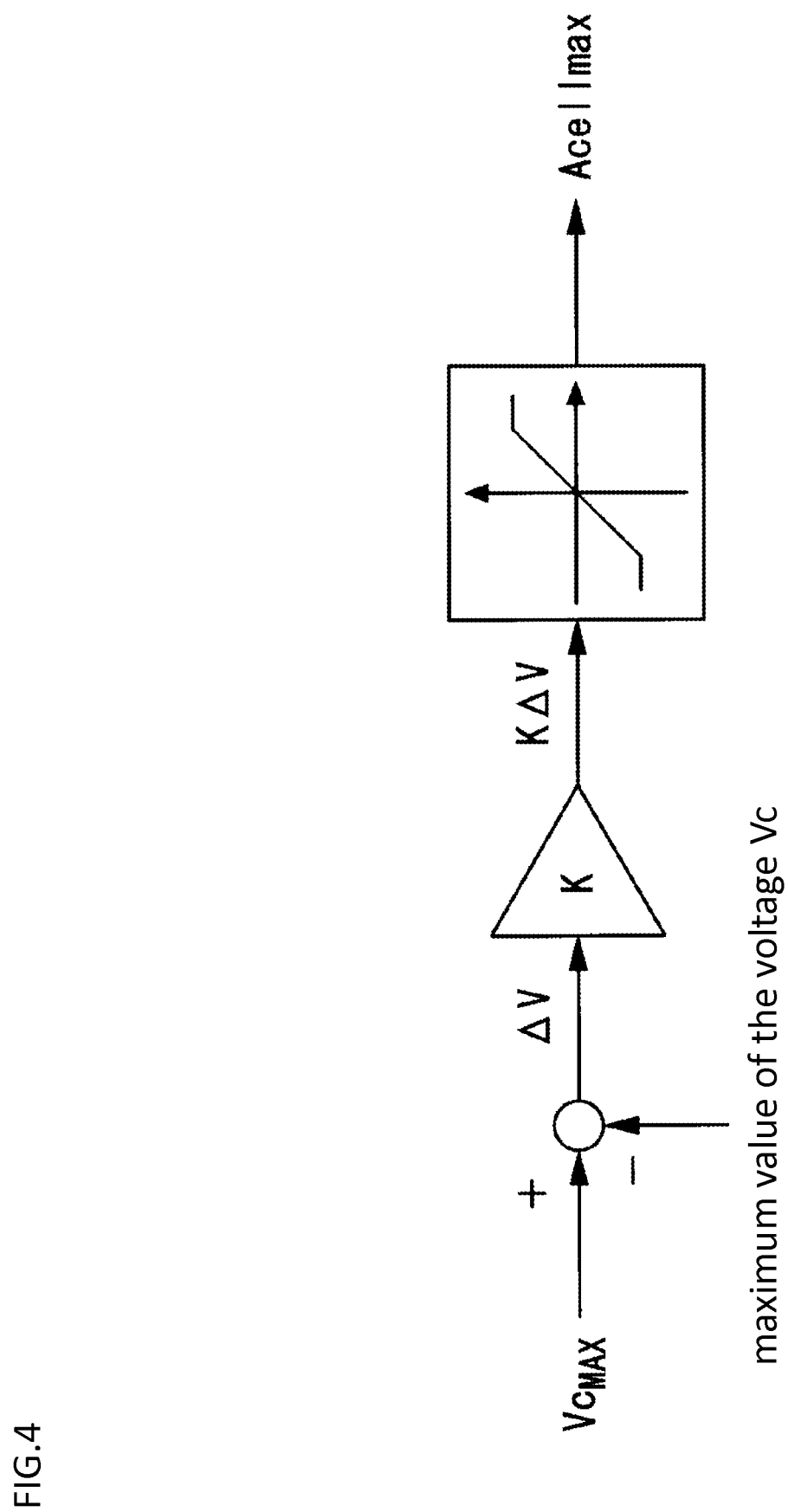
FIG. 4 is a diagram schematically showing processing details during charging in a maximum current determination unit 56.

Hereinafter, details of the process in the maximum current determination unit 56 will be described. FIG. 4 is a diagram schematically showing processing details during charging in the maximum current determination unit 56. During charging, first, the maximum current determination unit 56 subtracts a maximum value of the voltage Vc of the battery cell 21 from the upper limit voltage VcMAX of the battery cell 21 to calculate a difference $\Delta V$. The upper limit voltage VcMAX is a value which is determined in advance from a viewpoint of using the battery cell 21 with high efficiency while suppressing deterioration of the battery cell 21.

Here, the maximum current determination unit 56 sets a voltage at a zero current converted from the SOC of the battery cell 21 using the conversion table 62 as the voltage Vc of the battery cell 21. The conversion table 62 is a table in which a relationship between a predetermined SOC and a voltage at a zero current is specified.

Figure 5:
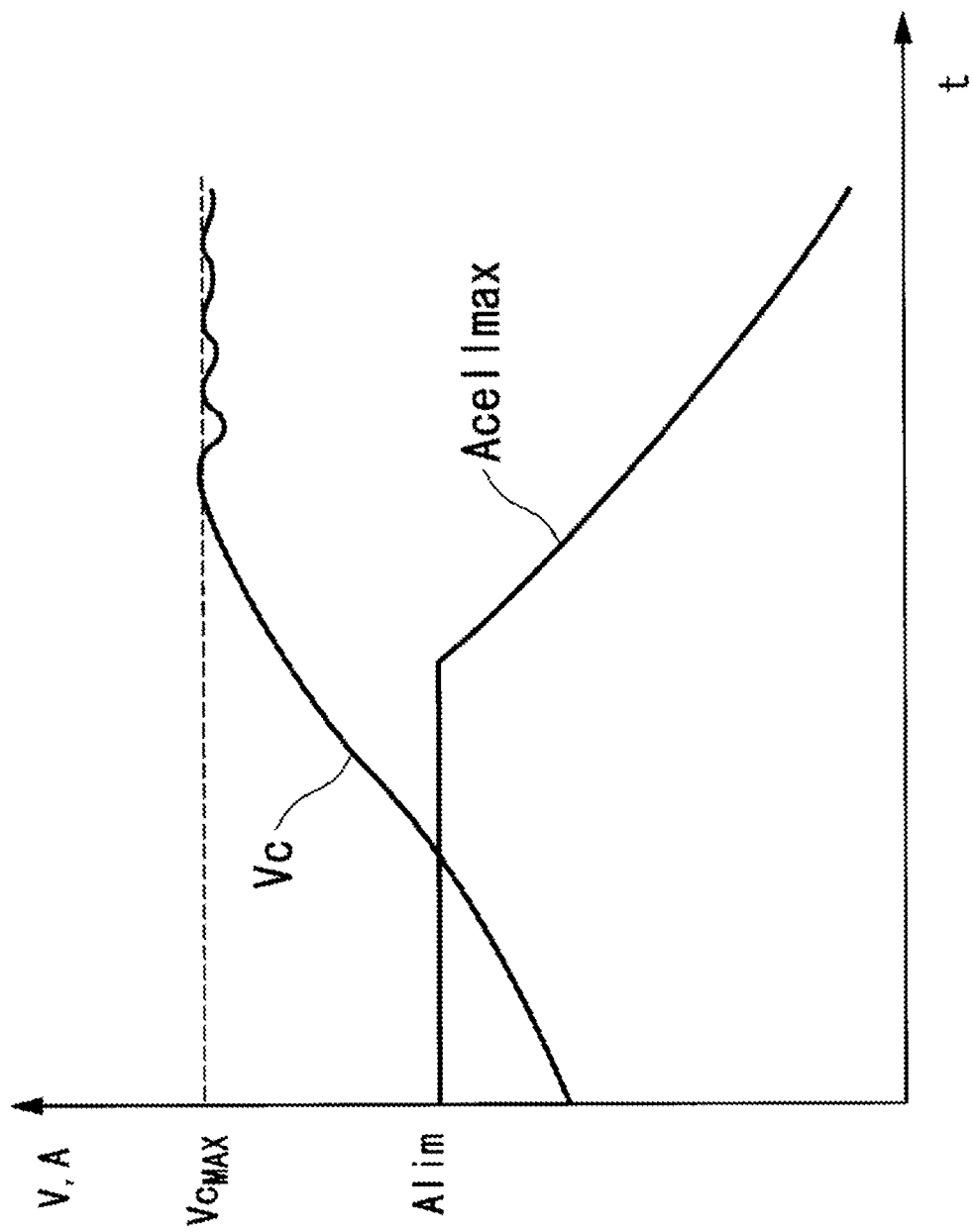
FIG. 5 is a diagram showing a change in a voltage Vc and a maximum current Acellmax of a battery cell 21 during charging.

The maximum current determination unit 56 multiplies the difference $\Delta V$ by a gain K. Then, the maximum current determination unit 56 limits a multiplication result K$\Delta V$ by an upper limit current Alim to calculate a maximum current Acellmax per battery cell 21. As a result, the voltage Vc and the maximum current Acellmax of the battery cell 21 during charging show change as shown in FIG. 5, for example. The upper limit current Alim is a value which is determined in advance from a viewpoint of suppressing deterioration of the battery cell 21. The upper limit current Alim is set in advance on the basis of a maximum charging/discharging current (a specification maximum current A*) in a specification of the battery module 20 or the battery cell 21. It is preferable that the upper limit current Alim is set to a value smaller than the specification maximum current A* in consideration of a margin for control, but the upper limit current Alim may be set to be equal to the specification maximum current A*.

FIG. 5 is a diagram showing change in the voltage Vc and the maximum current Acellmax of the battery cell 21 during charging. In the figure, an electric current is an absolute value for which a direction is not considered. As shown in the figure, during charging, the maximum current Acellmax continues to be at the upper limit current Alim in a case where the difference $\Delta V$ between the voltage Vc and the upper limit voltage VcMAX is sufficiently large, and tends to become smaller as the difference $\Delta V$ between the voltage Vc and the upper limit voltage VcMAX becomes smaller. As a result, rise of the voltage Vc slows down, so that the voltage Vc is changed to be gradually close to the upper limit voltage VcMAX. According to the power control apparatus 50 of the embodiment as described above, it is possible to accurately limit the voltage of the battery cell 21.

Figure 6:
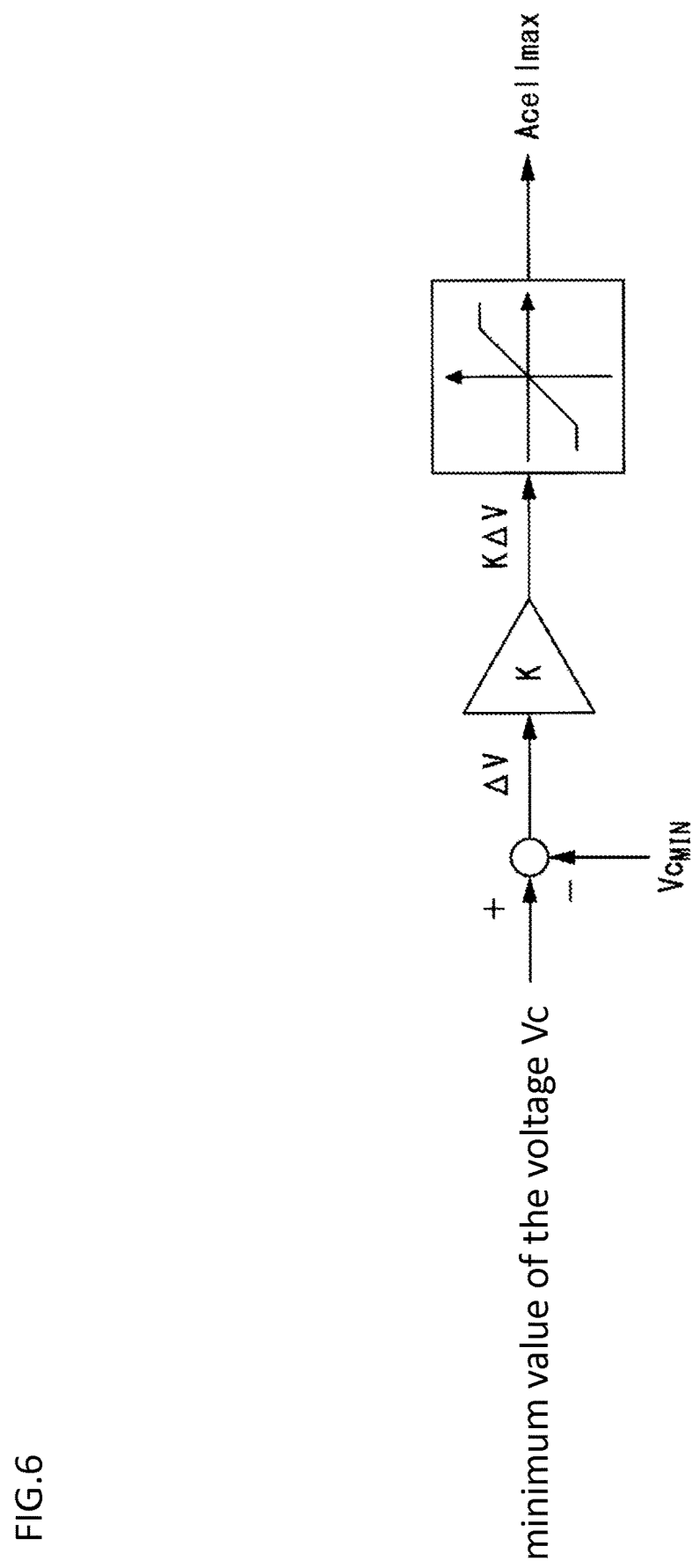
FIG. 6 is a diagram schematically showing processing details during discharging in the maximum current determination unit 56.

On the other hand, FIG. 6 is a diagram schematically showing processing details during discharging in the maximum current determination unit 56. During discharging, first, the maximum current determination unit 56 subtracts the lower limit voltage VcMIN of the battery cell 21 from a minimum value of the voltage Vc of the battery cell 21 to calculate a difference $\Delta V$. The lower limit voltage VcMIN is a value which is determined in advance from a viewpoint of using the battery cell 21 with high efficiency while suppressing deterioration of the battery cell 21.

Then, the maximum current determination unit 56 multiplies the difference $\Delta V$ by a gain K. Further, the maximum current determination unit 56 limits a multiplication result K$\Delta V$ by the upper limit current Alim to calculate a maximum current Acellmax per battery cell 21. As a result, the voltage Vc and the maximum current Acellmax of the battery cell 21 during charging show change as shown in FIG. 7, for example.

Figure 7:
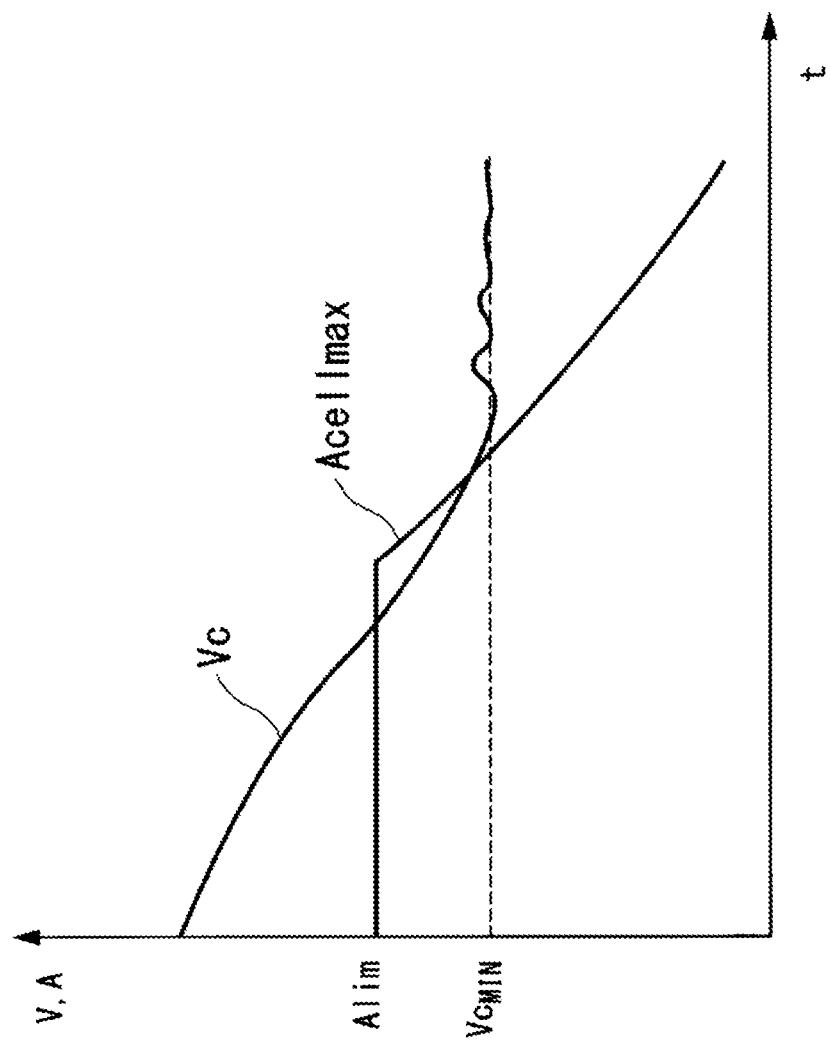
FIG. 7 is a diagram showing change in the voltage Vc and the maximum current Acellmax of the battery cell 21 during discharging.

FIG. 7 is a diagram showing change in the voltage Vc and the maximum current Acellmax of the battery cell 21 during discharging. In the figure, an electric current is an absolute value for which a direction is not considered. As shown in the figure, during discharging, the maximum current Acellmax continues to be at the upper limit current Alim in a case where the difference $\Delta V$ between the voltage Vc and the lower limit voltage VcMIN is sufficiently large, and tends to become smaller as the difference $\Delta V$ between the voltage Vc and the lower limit voltage VcMIN becomes smaller. As a result, drop of the voltage Vc slows down, so that the voltage Vc is changed to be gradually close to the lower limit voltage VcMIN. According to the power control apparatus 50 of the embodiment as described above, it is possible to accurately limit the voltage of the battery cell 21.

In addition, the maximum current determination unit 56 multiplies the allowable maximum current Acellmax per battery cell 21 by a module parallel number np_cell to calculate an allowable maximum current Acellmod per battery module 20. The module parallel number np_cell is the number of parallel battery cells 21 in the battery module 20. In the example of FIG. 2, the module parallel number np_cell is 2.

Furthermore, the maximum current determination unit 56 multiplies the allowable maximum current Acellmod per battery module 20 by a system parallel number np_mod to calculate a system maximum current Amax. The system maximum current Amax is the sum of maximum currents at which charging and discharging of each battery unit 10 are allowed in the power control system 1, and is a maximum current supplied to the control target 80 through the power lines PL. The system parallel number np_mod is the number of parallels in the system, that is, the number of parallel battery modules 20. In the example of FIG. 1, the system parallel number np_mod is n.

The control amount determination unit 58 sets a control amount to be given to the control target 80 using the system maximum current Amax as an upper limit value, on the basis of operation information input through the input device 70. For example, the control amount determination unit 58 first determines a primary command value of electric power generation to be given to the control target 80 on the basis of the operation information input through the input device 70. Then, if the primary command value does not exceed electric power generation corresponding to the system maximum current Amax, the control amount determination unit 58 gives the primary command value to the control target 80 as the control amount, and if the primary command value exceeds the electric power generation corresponding to the system maximum current Amax, the control amount determination unit 58 gives the electric power generation corresponding to the system maximum current Amax to the control target 80 as the control amount.

Figure 8:
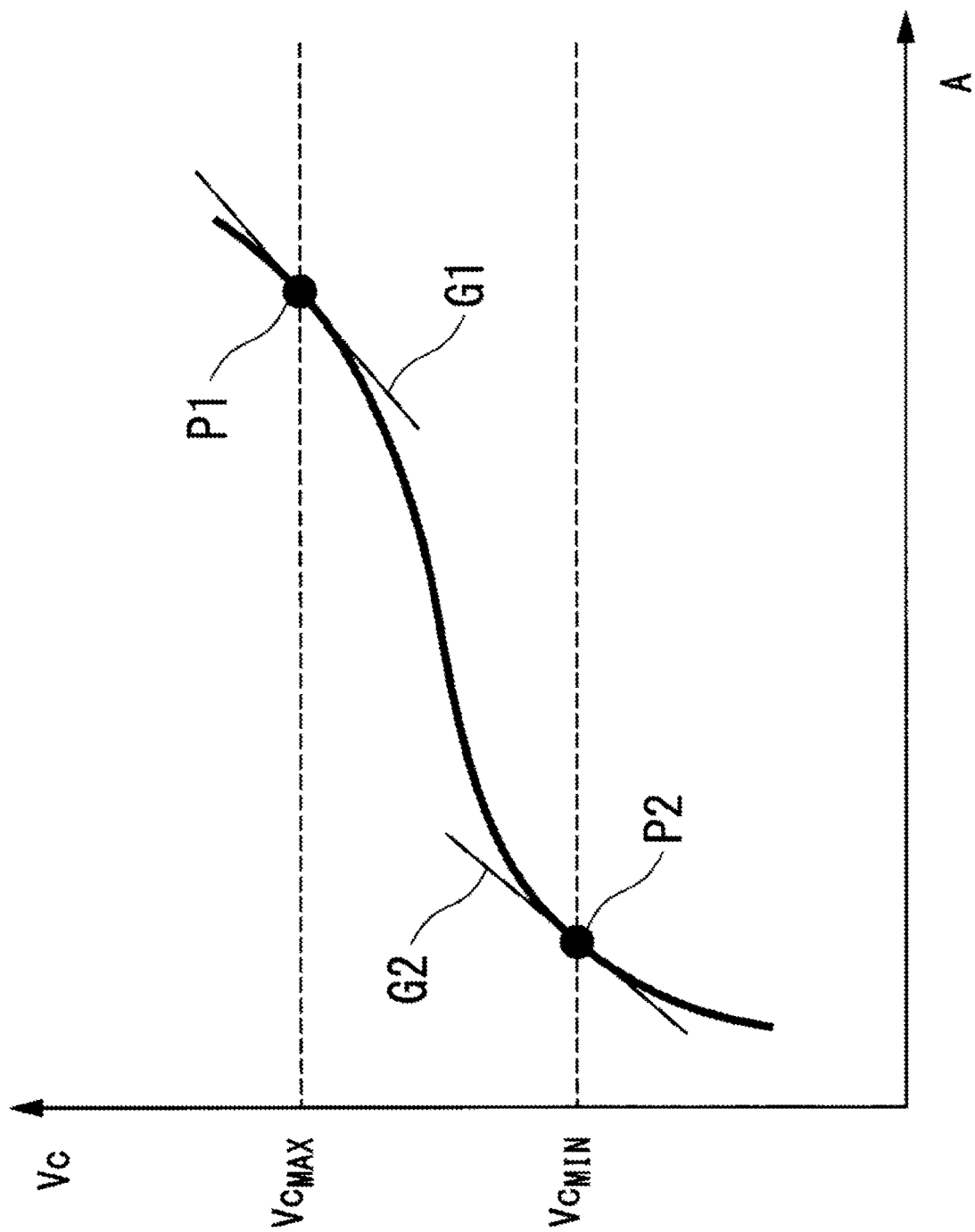
FIG. 8 is a diagram illustrating a relationship between a voltage/current characteristic and gains K of the battery cell 21.

In the first embodiment, the same gain K may be used during charging and discharging, but difference gains K may be used during charging and discharging. In this case, the gains K may be determined on the basis of a voltage/current characteristic of the battery cell 21. FIG. 8 is a diagram illustrating a relationship between a voltage/current characteristic and gains K of the battery cell 21. In the figure, a longitudinal axis represents the voltage Vc of the battery cell 21, and a lateral axis represents an integrated value of charging/discharging currents (which may be considered as a SOC). In this case, a characteristic curve gradient G1 at an intersection P1 between a curve (hereinafter, referred to as a characteristic curve) indicating the voltage/current characteristic of the battery cell 21 and the upper limit voltage VcMAX is compared with a characteristic curve gradient G2 at an intersection P2 between the characteristic curve and the lower limit voltage VcMIN. If the gradient G1 is larger than the gradient G2, the gain K during charging may be set to be larger than the gain K during discharging, and if the gradient G1 is smaller than the gradient G2, the gain K during charging may be set to be smaller than the gain K during discharging. Thus, it is possible to perform a control according to positions of the upper limit voltage VcMAX and the lower limit voltage VcMIN set with respect to the battery cell 21, and to appropriately prevent over-charging or over-discharging. If the gradient of the characteristic curve is large, since it is necessary to rapidly attenuate a charging current or a discharging current at that time point, it is necessary to set the gain K to a large value in advance. Further, in the first embodiment, the upper limit current Alim during charging and the upper limit current Alim during discharging may be set to be different from each other.

According to the power control apparatus 50 of the first embodiment described above, by providing the acquisition unit 52 that acquires information relating to a voltage of the chargeable/dischargeable battery cell 21 during charging, and the maximum current determination unit 56 that determines the maximum current Acellmax of the battery cell 21 during charging on the basis of the information acquired by the acquisition unit 52 so that the maximum current Acellmax tends to become smaller as a difference between the upper limit voltage VcMAX and the voltage Vc of the battery cell 21 becomes smaller and is limited by the upper limit current Alim, it is possible to accurately limit the voltage of the battery cell 21 in a system where a relatively large electric current flows.

In addition, according to the power control apparatus 50 of the first embodiment described above, by providing the acquisition unit 52 that acquires information relating to a voltage of the chargeable/dischargeable battery cell 21 during discharging, and the maximum current determination unit 56 that determines the maximum current Acellmax of the battery cell 21 during discharging on the basis of the information acquired by the acquisition unit 52 so that the maximum current Acellmax tends to become smaller as a difference between the lower limit voltage VcMIN and the voltage Vc of the battery cell 21 becomes smaller and is limited by the upper limit current Alim, it is possible to accurately limit the voltage of the battery cell 21 in a system where a relatively large electric current flows.

Furthermore, according to the power control apparatus 50 of the first embodiment, since the system maximum current Amax is calculated on the basis of the maximum value or the minimum value of the voltage Vc of the battery cell 21, it is possible to perform a control on a safety side according to a progressing state of deterioration that shows an individual difference for each battery cell 21.

(Second Embodiment)

Hereinafter, a second embodiment will be described. A power control apparatus 50 according to the second embodiment is different from the first embodiment in processing details of the maximum current determination unit 56, and is the same as the first embodiment in terms of other points. Accordingly, regarding a configuration, FIGS. 1 to 3 are used, and description of the same portions will not be repeated.

The maximum current determination unit 56 of the second embodiment determines a maximum current of the battery cell 21 during charging or discharging, on the basis of comparison of a voltage of the battery cell 21 obtained from information acquired by an acquisition unit 52 and the upper limit voltage VcMAX or the lower limit voltage VcMIN. In the second embodiment, similar to the first embodiment, a voltage at a zero current converted from the SOC of the battery cell 21 using the conversion table 62 is sets as the voltage Vc of the battery cell 21.

The maximum current determination unit 56 of the second embodiment repeatedly determines the maximum current Acellmax of the battery cell 21 during charging at a predetermined cycle. Then, if a difference between the upper limit voltage VcMAX and the voltage Vc of the battery cell 21 is smaller than a first predetermined voltage V1, the maximum current determination unit 56 determines the maximum current Acellmax of the battery cell 21 during charging to be a value obtained by subtracting a step voltage α from the maximum current Acellmax determined last time.

Further, the maximum current determination unit 56 of the second embodiment repeatedly determines the maximum current Acellmax of the battery cell 21 during discharging at a predetermined cycle. Then, if a difference between the voltage Vc of the battery cell 21 and the lower limit voltage VcMIN is smaller than a second predetermined voltage V2, the maximum current determination unit 56 determines the maximum current Acellmax of the battery cell 21 during charging to be a value obtained by subtracting the step voltage α, from the maximum current Acellmax determined last time.

Figure 9:
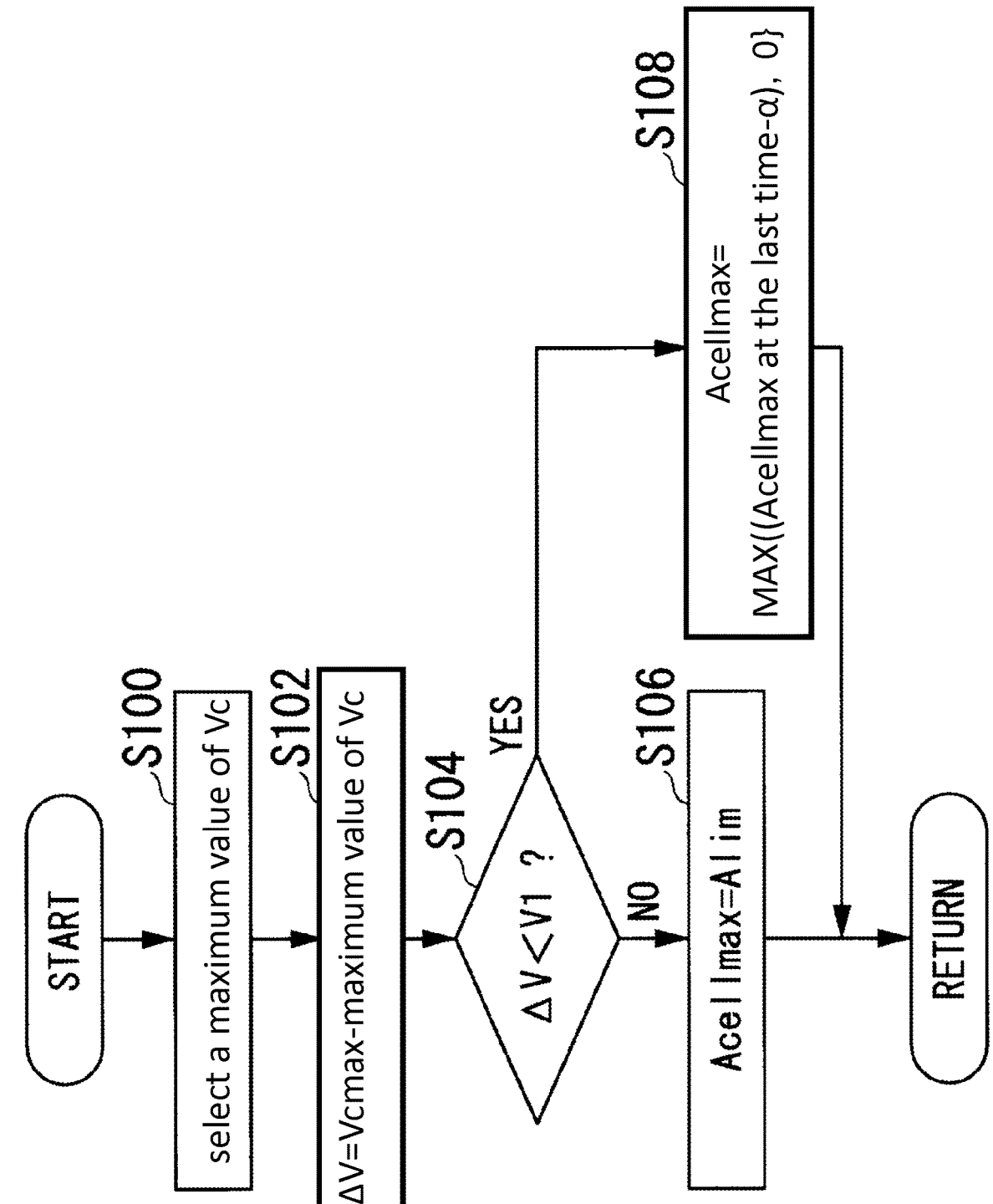
FIG. 9 is a flowchart showing an exemplary flow of a process executed during charging of the battery cell 21 by the maximum current determination unit 56 according to a second embodiment.

FIG. 9 is a flowchart showing an exemplary flow of a process executed during charging of the battery cell 21 by the maximum current determination unit 56 according to the second embodiment. The process of this flowchart is repeatedly executed at a predetermined cycle.

First, the maximum current determination unit 56 selects a maximum value of the battery cell 21 (step S100). Then, the maximum current determination unit 56 subtracts the maximum value of the voltage Vc of the battery cell 21 from the upper limit voltage VcMAX of the battery cell 21 to calculate a difference ΔV (step S102). The upper limit voltage VcMAX is a value which is determined in advance from a viewpoint of using the battery cell 21 with high efficiency while suppressing deterioration of the battery cell 21.

Then, the maximum current determination unit 56 determines whether the difference ΔV is smaller than the first predetermined voltage V1 (step S104). If the difference ΔV is not smaller than the first predetermined voltage V1, the maximum current determination unit 56 determines the maximum current Acellmax per battery cell 21 as the upper limit current Alim (step S106).

On the other hand, if the difference ΔV is smaller than the first predetermined voltage V1, the maximum current determination unit 56 determines the maximum current Acellmax per battery cell 21 to be a value obtained by subtracting the step voltage α from the maximum current Acellmax determined when one routine of the flowchart has been executed the last time (step S108). Here, in a case where the value obtained by subtracting the step voltage α becomes a negative value, the maximum current determination unit 56 determines the maximum current Acellmax to be zero (or a relatively small predetermined value).

Figure 10:
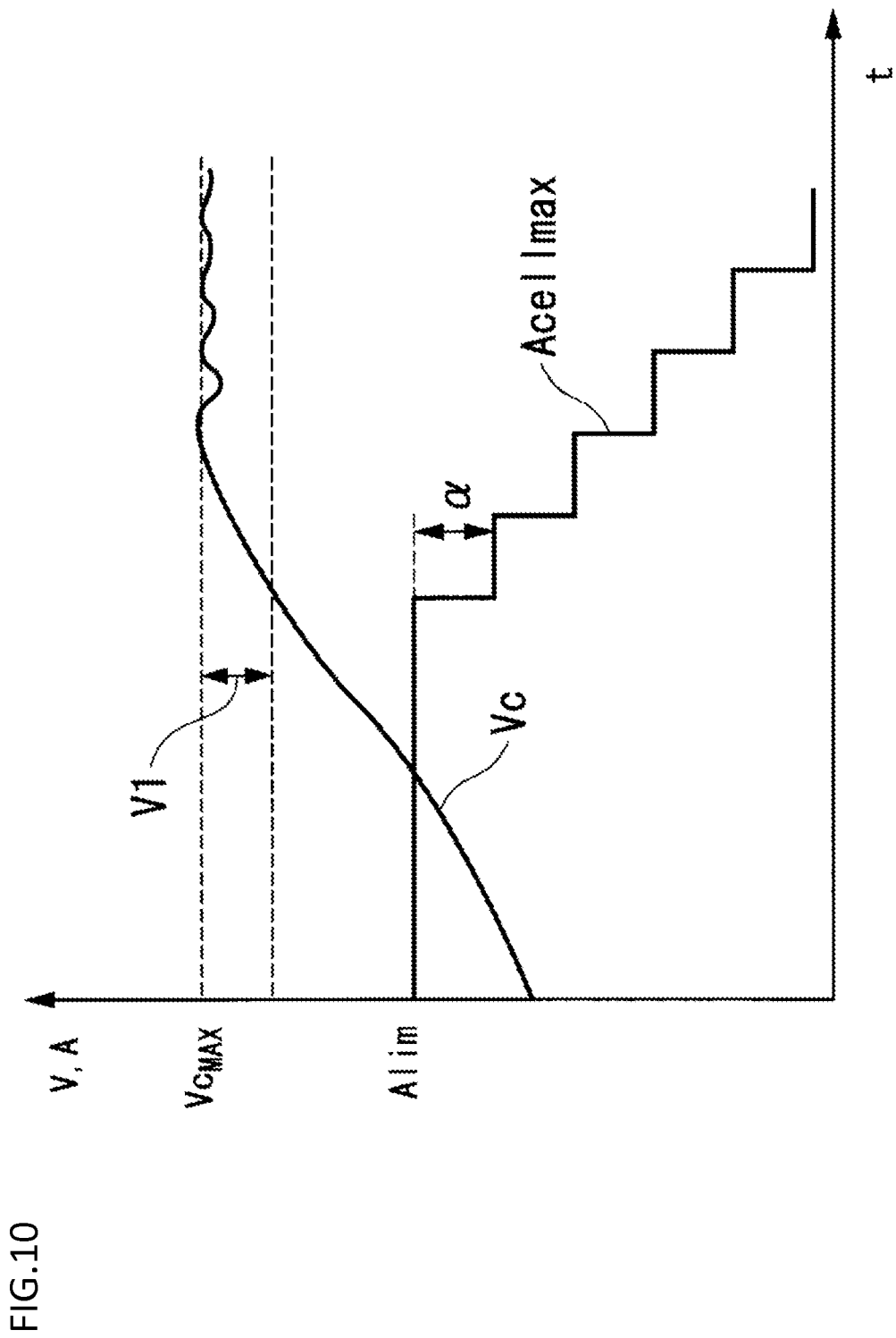
FIG. 10 is a diagram showing change in the voltage Vc and the maximum current Acellmax of the battery cell 21 during charging as a result obtained by performing the process shown in FIG. 9.

FIG. 10 is a diagram showing change in the voltage Vc and the maximum current Acellmax of the battery cell 21 during charging, which is a result obtained by performing the process shown in FIG. 9. In the figure, an electric current is an absolute value for which a direction is not considered. As shown in the figure, during a period in which the difference ΔV is equal to or larger than the first predetermined voltage V1, the maximum current Acellmax per battery cell 21 is maintained at the upper limit current Alim. If the difference ΔV becomes smaller than the first predetermined voltage VI, the maximum current Acellmax per battery cell 21 is determined to decrease by the step voltage α at each control cycle and to be gradually close to zero. As a result, rise of the voltage Vc slows down, so that the voltage Vc is changed to be gradually close to the upper limit voltage VcMAX. In this way, according to the power control apparatus 50 of the embodiment, it is possible to accurately limit the voltage of the battery cell 21.

Figure 11:
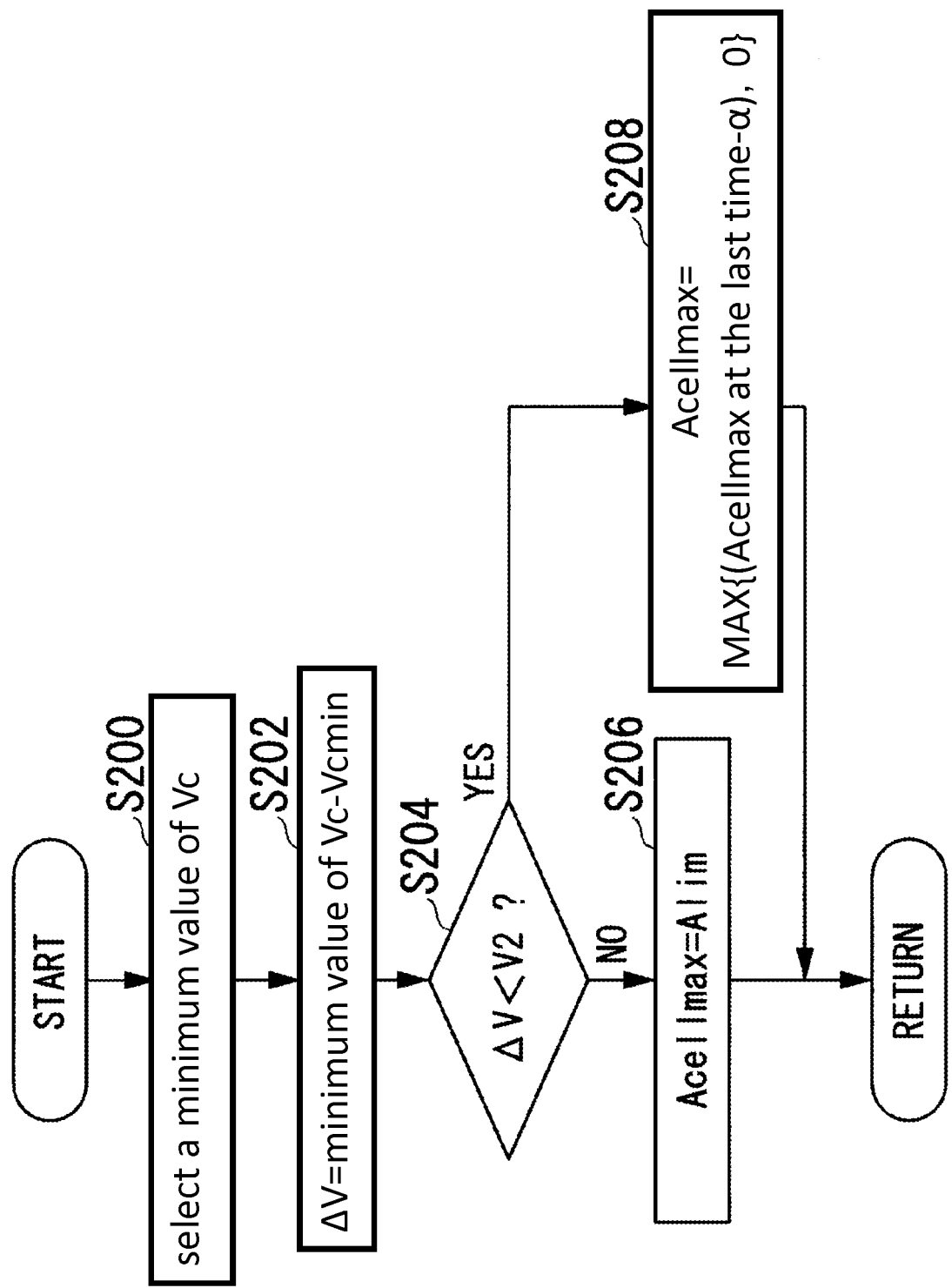
FIG. 11 is a flowchart showing an exemplary flow of a process executed during discharging of the battery cell 21 by the maximum current determination unit 56 according to the second embodiment.

FIG. 11 is a flowchart showing an exemplary flow of a process executed during discharging of the battery cell 21 by the maximum current determination unit 56 according to the second embodiment. The process of this flowchart is repeatedly executed at a predetermined cycle.

First, the maximum current determination unit 56 selects a minimum value of the battery cell 21 (step S200). Then, the maximum current determination unit 56 subtracts the lower limit voltage VcMIN of the battery cell 21 from the minimum value of the voltage Vc of the battery cell 21 to calculate a difference ΔV (step S202).

The lower limit voltage VcMIN is a value which is determined in advance from a viewpoint of using the battery cell 21 with high efficiency while suppressing deterioration of the battery cell 21.

Then, the maximum current determination unit 56 determines whether the difference ΔV is smaller than a second predetermined voltage V2 (step S204). If the difference ΔV is not smaller than the second predetermined voltage V2, the maximum current determination unit 56 determines the maximum current Acellmax per battery cell 21 to be the upper limit current Alim (step S206). Here, the first predetermined voltage V1 and the second predetermined voltage V2 may be the same value, or may be different values.

On the other hand, if the difference ΔV is smaller than the second predetermined voltage V2, the maximum current determination unit 56 determines the maximum current Acellmax per battery cell 21 to be a value obtained by subtracting the step voltage α from the maximum current Acellmax determined when one routine of the flowchart has been executed the last time (step S208). Here, in a case where the value obtained by subtracting the step voltage α becomes a negative value, the maximum current determination unit 56 determines the maximum current Acellmax to be zero (or a relatively small predetermined value).

Figure 12:
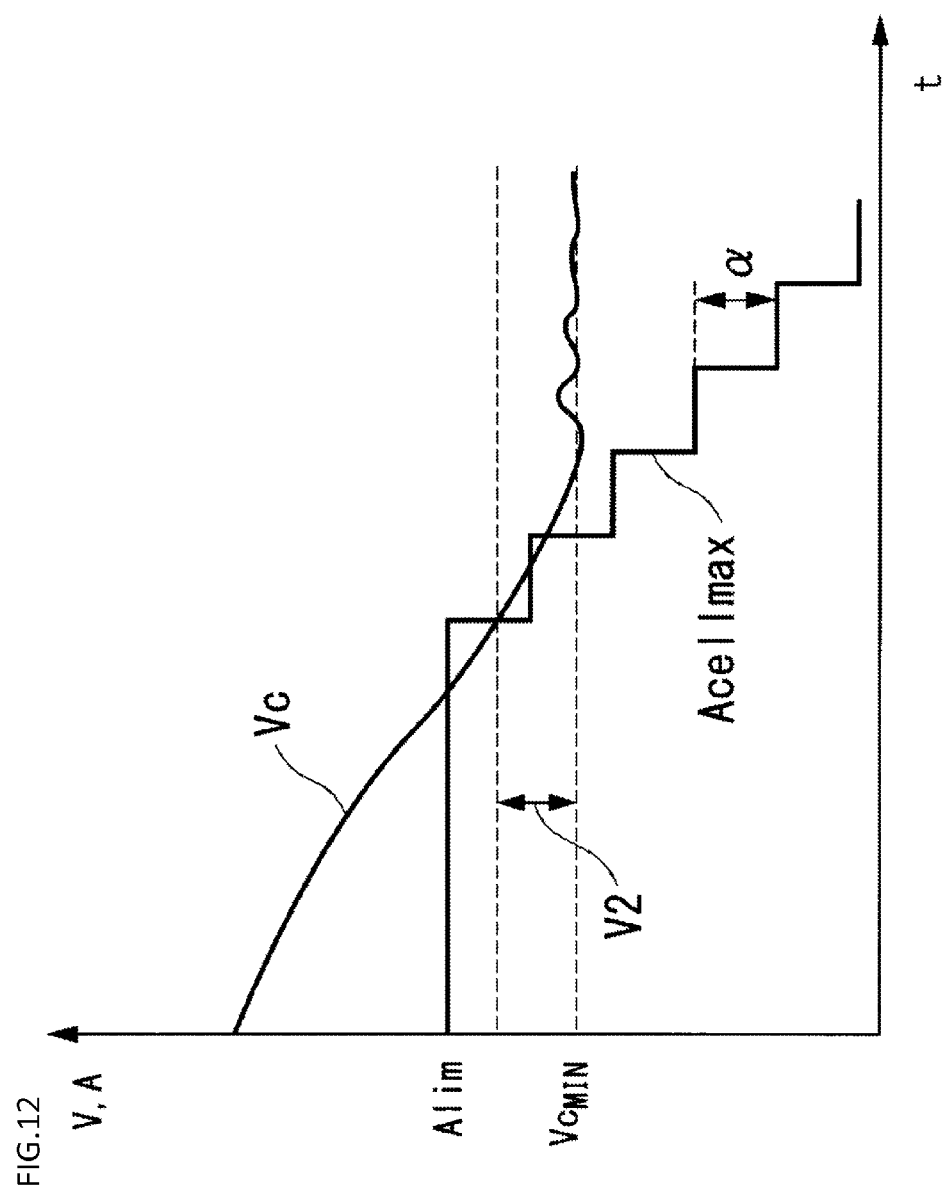
FIG. 12 is a diagram showing change in the voltage Vc and the maximum current Acellmax of the battery cell 21 during discharging as a result obtained by performing the process shown in FIG. 11.

FIG. 12 is a diagram showing change in the voltage Vc and the maximum current Acellmax of the battery cell 21 during discharging, which is a result obtained by performing the process shown in FIG. 11. In the figure, an electric current is an absolute value for which a direction is not considered. As shown in the figure, the maximum current Acellmax per battery cell 21 is maintained at the upper limit current Alim during a period in which the difference ΔV is equal to or larger than the second predetermined voltage V2. If the difference ΔV becomes smaller than the second predetermined voltage V2, the maximum current Acellmax per battery cell 21 is determined to decrease by the step voltage cc at each control cycle and to be close to zero. As a result, drop of the voltage Vc slows down, so that the voltage Vc is changed to be gradually close to the lower limit voltage VcMIN. In this way, according to the power control apparatus 50 of the embodiment, it is possible to accurately limit the voltage of the battery cell 21.

In addition, the maximum current determination unit 56 multiplies the allowable maximum current Acellmax per battery cell 21 by a module parallel number np_cell to calculate an allowable maximum current Acellmod per battery module 20. The module parallel number np_cell is the number of parallel battery cells 21 in the battery module 20. In the example of FIG. 2, the module parallel number np_cell is 2.

Furthermore, the maximum current determination unit 56 multiplies the allowable maximum current Acellmod per battery module 20 by a system parallel number np_mod to calculate a system maximum current Amax. The system maximum current Amax is the sum of maximum currents at which charging and discharging of each battery unit 10 are allowed in the power control system 1, and is a maximum current supplied to the control target 80 through the power lines PL. The system parallel number np_mod is the number of parallels in the system, that is, the number of parallel battery modules 20. In the example of FIG. 1, the system parallel number np_mod is n.

The control amount determination unit 58 sets a control amount to be given to the control target 80 using the system maximum current Amax as an upper limit value, on the basis of operation information input through the input device 70. For example, the control amount determination unit 58 first determines a primary command value of electric power generation to be given to the control target 80 on the basis of the operation information input through the input device 70. Then, if the primary command value does not exceed electric power generation corresponding to the system maximum current Amax, the control amount determination unit 58 gives the primary command value to the control target 80 as the control amount, and if the primary command value exceeds the electric power generation corresponding to the system maximum current Amax, the control amount determination unit 58 gives the electric power generation corresponding to the system maximum current Amax to the control target 80 as the control amount.

In the second embodiment, the same step voltage α may be used during charging and discharging, but difference step voltages α may be used during charging and discharging. In this case, the step voltages a may be determined on the basis of a voltage/current characteristic of the battery cell 21. This will be described with reference to FIG. 8. Similar to the first embodiment, a characteristic curve gradient G1 of at an intersection P1 between a curve (hereinafter, referred to as a characteristic curve) indicating a voltage/current characteristic of the battery cell 21 and the upper limit voltage VcMAX is compared with a characteristic curve gradient G2 at an intersection P2 between the characteristic curve and the lower limit voltage VcMIN. If the gradient G1 is larger than the gradient G2, the step voltage α during charging may be set to be larger than the step voltage α during discharging, and if the gradient G1 is smaller than the gradient G2, the step voltage α during charging may be set to be smaller than the step voltage α during discharging. Thus, it is possible to perform a control according to positions of the upper limit voltage VcMAX and the lower limit voltage VcMIN set with respect to the battery cell 21, and to more appropriately prevent over-charging or over-discharging. If the gradient of the characteristic curve is large, since it is necessary to rapidly attenuate a charging current or a discharging current at that time point, it is necessary to set the step voltage α to a large value in advance.

Similarly, if the gradient G1 is larger than the gradient G2, the first predetermined voltage V1 may be set to be larger than the second predetermined voltage V2, and if the gradient G1 is smaller than the gradient G2, the first predetermined voltage V1 may be set to be smaller than the second predetermined voltage V2. Thus, it is possible to more quickly limit the maximum current Acellmax on a side where the gradient is steep, and to appropriately prevent over-charging or over-discharging. In addition, in the second embodiment, the upper limit current Alim during charging and the upper limit current Alim during discharging may be set to be different from each other.

Further, in the second embodiment, a configuration in which in a case where the difference ΔV is not smaller than the first predetermined voltage V1, the maximum current Acellmax per battery cell 21 is determined as the upper limit current Alim, that is, a configuration in which if the difference ΔV is equal to or larger than the first predetermined voltage VI, the maximum current Acellmax per battery cell 21 directly returns to the upper limit current Alim is shown, but instead, a configuration in which the maximum current Acellmax per battery cell 21 returns closer to the upper limit current Alim by a step voltage β may be used. Accordingly, it is possible to smoothly perform the current control. Hereinafter, a flow of the process in this case will be described.

Figure 13:
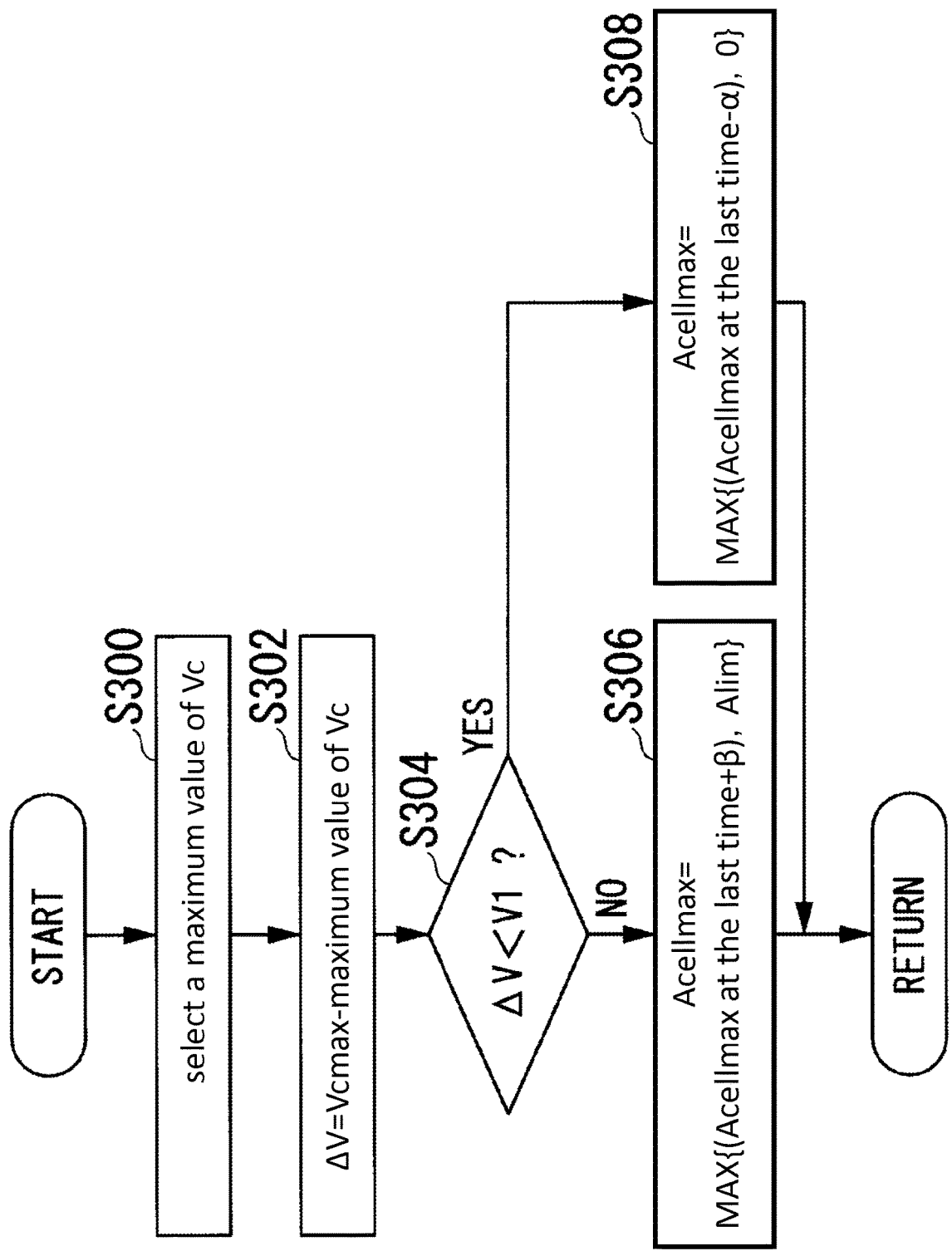
FIG. 13 is a flowchart showing an exemplary flow of a process executed during charging of the battery cell 21 by the maximum current determination unit 56 according to the second embodiment.

FIG. 13 is a flowchart showing another exemplary flow of the process executed during charging of the battery cell 21 by the maximum current determination unit 56 according to the second embodiment. The process of this flowchart is repeatedly executed at a predetermined cycle.

First, the maximum current determination unit 56 selects a maximum value of the battery cell 21 (step S300). Then, the maximum current determination unit 56 subtracts the maximum value of the voltage Vc of the battery cell 21 from the upper limit voltage VcMAX of the battery cell 21 to calculate a difference ΔV (step S302).

Then, the maximum current determination unit 56 determines whether the difference ΔV is smaller than the first predetermined voltage V1 (step S304). If the difference ΔV is not smaller than the first predetermined voltage V1, the maximum current determination unit 56 determines the maximum current Acellmax per battery cell 21 to be a value obtained by adding the step voltage β for return to the maximum current Acellmax determined when one routine of the flowchart has been executed last time (step S306). Here, in a case where the value obtained by adding the step voltage β exceeds the upper limit current Alim, the maximum current determination unit 56 determines the maximum current Acellmax to be the upper limit current Alim.

On the other hand, if the difference AV is smaller than the first predetermined voltage V1, the maximum current determination unit 56 determines the maximum current Acellmax per battery cell 21 to be a value obtained by subtracting the step voltage cc from the maximum current Acellmax determined when one routine of the flowchart has been executed last time (step S308). Here, in a case where the value obtained by subtracting the step voltage cc becomes a negative value, the maximum current determination unit 56 determines the maximum current Acellmax to be zero (or a relatively small predetermined value).

Figure 14:
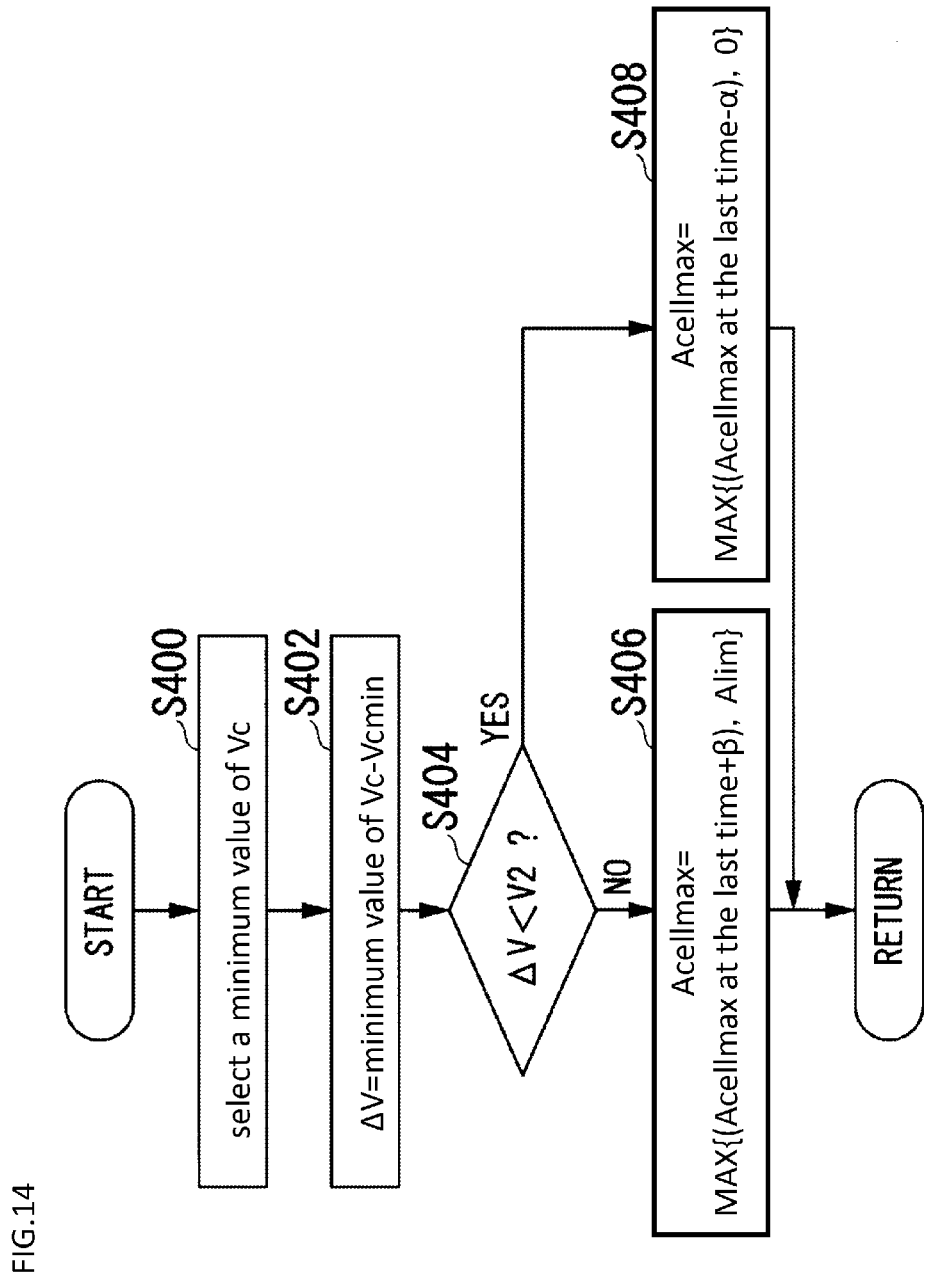
FIG. 14 is a flowchart showing another exemplary flow of the process executed during discharging of the battery cell 21 by the maximum current determination unit 56 according to the second embodiment.

FIG. 14 is a flowchart showing another exemplary flow of the process executed during discharging of the battery cell 21 by the maximum current determination unit 56 according to the second embodiment. The process of this flowchart is repeatedly executed at a predetermined cycle.

First, the maximum current determination unit 56 selects a minimum value of the battery cell 21 (step S400). Then, the maximum current determination unit 56 subtracts the lower limit voltage VcMIN of the battery cell 21 from the minimum value of the voltage Vc of the battery cell 21 to calculate a difference ΔV (step S402).

Then, the maximum current determination unit 56 determines whether the difference ΔV is smaller than the second predetermined voltage V2 (step S404). if the difference ΔV is not smaller than the second predetermined voltage V2, the maximum current determination unit 56 determines the maximum current Acellmax per battery cell 21 to be a value obtained by adding the step voltage β for return to the maximum current Acellmax determined when one routine of the flowchart has been executed last time (step S406). Here, in a case where the value obtained by adding the step voltage β exceeds the upper limit current Alim, the maximum current determination unit 56 determines the maximum current Acellmax to be the upper limit current Alim.

On the other hand, if the difference ΔV is smaller than the second predetermined voltage V2, the maximum current determination unit 56 determines the maximum current Acellmax per battery cell 21 to be a value obtained by subtracting the step voltage α from the maximum current Acellmax determined when one routine of the flowchart has been executed last time (step S408). Here, in a case where the value obtained by subtracting the step voltage α becomes a negative value, the maximum current determination unit 56 determines the maximum current Acellmax to be zero (or a relatively small predetermined value).

According to the power control apparatus 50 of the second embodiment described above, similar to the first embodiment, it is possible to more accurately limit the voltage of the battery cell 21 in a system where a relatively large electric current flows.

In addition, according to the power control apparatus 50 of the second embodiment described above, since the maximum current Acellmax is decreased for each step voltage α, it is possible to prevent a determined value of the maximum current Acellmax from oscillating.

Furthermore, according to the power control apparatus 50 of the second embodiment, since the system maximum current Amax is calculated on the basis of the maximum value or the minimum value of the voltage Vc of the battery cell 21, it is possible to perform a control on a safety side according to a progressing state of deterioration that shows an individual difference for each battery cell 21.

(Common Modification Example)

In the above-described respective embodiments, the power control apparatus 50 has a configuration for determining the maximum current Acellmax of the battery cell 21 so that the voltage of the battery cell 21 during charging does not exceed the upper limit voltage VcMAX and also has a configuration for determining the maximum current Acellmax of the battery cell 21 so that the voltage of the battery cell 21 during discharging does not fall under the lower limit voltage VcMIN, but may have only one configuration among the two configurations.

Further, the connection configuration of the batteries shown in FIGS. 1 and 2 is merely an example, and for example, the power control system 1 may be provided with only one battery unit 10. In addition, the power control apparatus 50 may be integrated with the BMU 40.

(Application Example)

Figure 15:
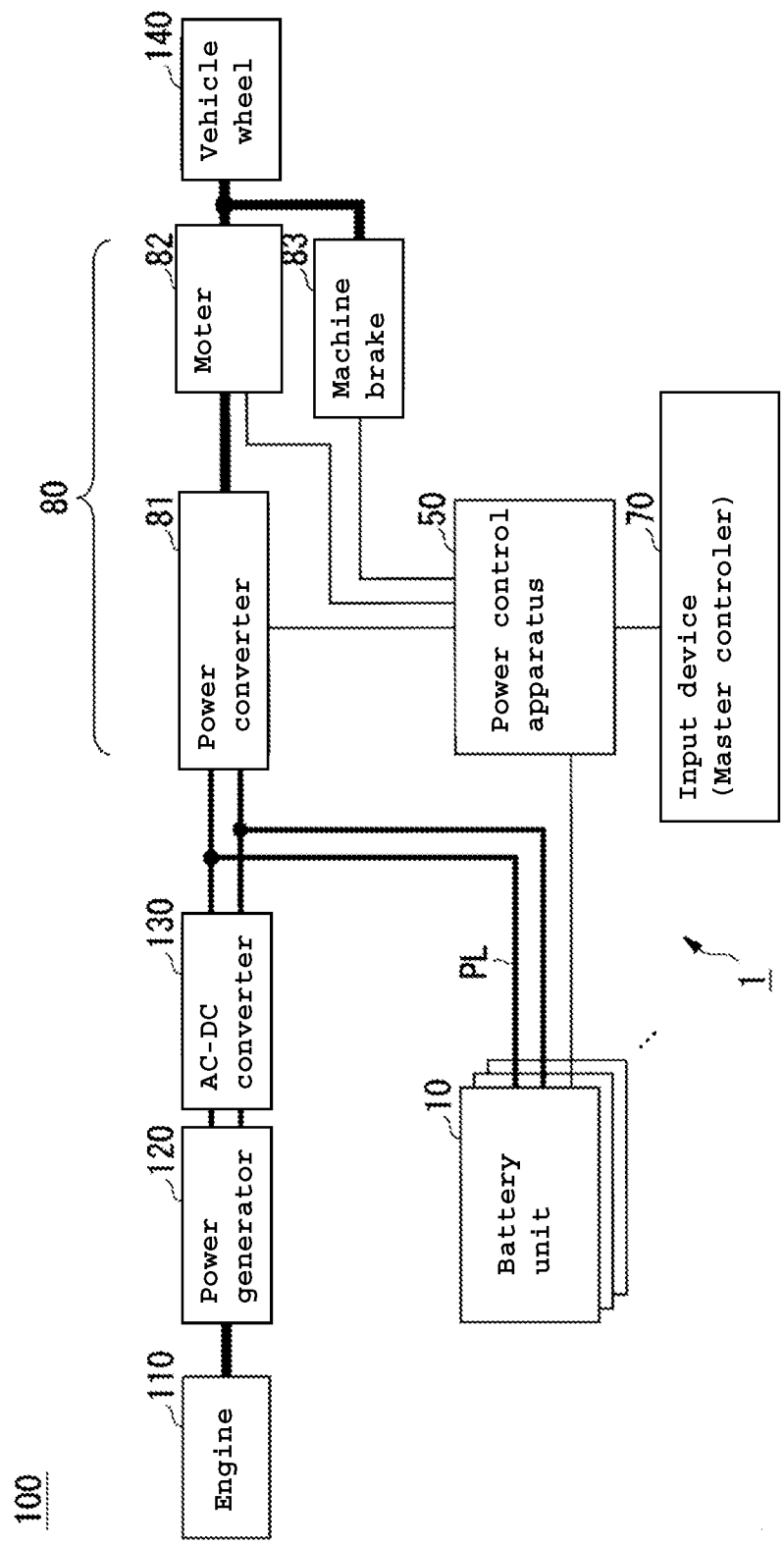
FIG. 15 is a diagram showing an exemplary configuration of a mobile system 100 using the power control system 1.
Figure 16:
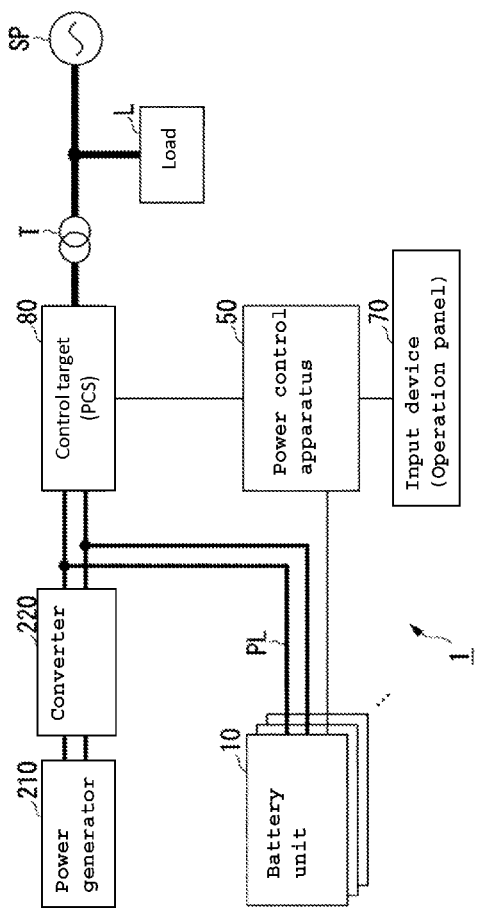
FIG. 16 is a diagram showing an exemplary configuration of a stationary type battery system 200 using the power control system 1.

Hereinafter, an application example of the power control system 1 will be described. FIG. 15 is a diagram showing an exemplary configuration of a mobile system 100 using the power control system 1. The mobile system 100 is a system that drives a hybrid railroad vehicle (hereinafter, referred to as a vehicle), for example. The mobile system 100 includes the power control system 1, and further includes an engine 110, a power generator 120, an AC-DC converter 130, and a vehicle wheel 140. In FIG. 15 and FIG. 16 (which will be described later), a battery unit 10 is shown on behalf of a plurality of battery units.

The engine 110 outputs power by burning fuel such as gasoline. The power generator 120 generates electricity using the power output from the engine 110. The AC-DC converter 130 converts a two-phase or three-phase alternating current output from the power generator 120 into a direct current, and outputs the result.

A power line PL that extends from the battery unit 10 is combined with a power line on an output side of the AC-DC converter 130 through a direct current link circuit, and then, is connected to a power converter 81. In the example of FIG. 9, as the control target 80 of the power control apparatus 50, the power converter 81, a motor 82, a machine brake 83 are shown.

The power converter 81 converts an input direct current into an alternating current and outputs the result to the motor 82, or converts electric power regenerated by the motor 82 into a direct current and provides the result to the battery unit 10. The motor 82 rotates the vehicle wheel 140 to drive the vehicle, or generates electricity through regeneration during deceleration of the vehicle. The machine brake 83 is a device for decelerating the vehicle using a mechanical action.

Further, the mobile system 100 includes a master controller that is capable of inputting a notch instruction or a brake instruction as the input device 70.

During discharging of the battery unit 10, the power control apparatus 50 calculates power to be output to the vehicle wheel 140 on the basis of a notch instruction which is operation information input from the master controller 70, and subtracts power that can be output by the engine 110 from the calculated power to calculate power discharged by the battery unit 10. In addition, the power control apparatus 50 calculates an electric current that flows from the battery unit 10 on the basis of the power discharged by the battery unit 10, and determines whether the calculated electric current exceeds the above-described system maximum current Amax. If the calculated electric current exceeds the system maximum current Amax, the power control apparatus 50 limits a duty ratio to be given to the power converter 81, or outputs an instruction for increasing the power output by the engine 110 to an engine controller (not shown).

During charging of the battery unit 10, the power control apparatus 50 calculates a regenerative power that acts on the vehicle wheel 140 on the basis of the brake instruction which is the operation information input from the master controller 70, and calculates power that can be charged to the battery unit 10 on the basis of the regenerative power. Further, the power control apparatus 50 calculates an electric current that flows into the battery unit 10 on the basis of the power that can be charged to the battery unit 10, and determines whether the calculated electric current exceeds the above-described system maximum current Amax. If the calculated electric current exceeds the system maximum current Amax, the power control apparatus 50 performs a control for operating the machine brake 83 to limit the power generated by the motor 82, for example.

As an application example of the power control system 1, the hybrid railroad vehicle is shown, but the application example is not limiting. The power control system 1 may be also applied to a stationary type battery system connected to a power generator such as a solar panel (PV) or a fuel cell (FC) and a system power. FIG. 16 is a diagram showing an exemplary configuration of a stationary type battery system 200 using the power control system 1.

A power generator 210 is a solar panel (PV), a fuel cell (FC), or the like. In a case where the power generator 210 generates an alternating current, a converter 220 is an AC-DC converter, and in a case where the power generator 210 generates direct current, the converter 220 is a DC-DC converter. The control target 80 is a power conditioning system (PCS), for example. The PCS is connected to a system power SP and a load L through a transformer T. Thus, power generated by the power generator 210 is supplied to the side of the system power SP while being accumulated in the battery unit 10.

In this case, the power control apparatus 50 controls the control target 80 so that an electric current that flows out of the battery unit 10 does not exceed the system maximum current Amax. For example, the power control apparatus 50 performs a control so that a duty ratio given to the PCS does not exceed a duty ratio corresponding to the system maximum current Amax. In addition, the power generator 210 and the converter 220 may be included as control targets in this case, and the power control apparatus 50 may control the power generator 210 and the converter 220 so that an electric current that flows into the battery unit 10 does not exceed the system maximum current Amax.

According to at least one embodiment described above, by providing the acquisition unit 52 that acquires information relating to a voltage of the chargeable/dischargeable battery cell 21 during charging, and the maximum current determination unit 56 that determines the maximum current Acellmax of the battery cell 21 during charging on the basis of the information acquired by the acquisition unit 52 so that the maximum current Acellmax tends to become smaller as a difference between the upper limit voltage VcMAX and the voltage Vc of the battery cell 21 becomes smaller and is limited by the upper limit current Alim, it is possible to accurately limit the voltage of the battery cell 21 in a system where a relatively large electric current flows.

In addition, according to at least one embodiment described above, by providing the acquisition unit 52 that acquires information relating to a voltage of the chargeable/dischargeable battery cell 21 during discharging, and the maximum current determination unit 56 that determines the maximum current Acellmax of the battery cell 21 during discharging on the basis of the information acquired by the acquisition unit 52 so that the maximum current Acellmax tends to become smaller as a difference between the lower limit voltage VcMIN and the voltage Vc of the battery cell 21 becomes smaller and is limited by the upper limit current Alim, it is possible to accurately limit the voltage of the battery cell 21 in a system where a relatively large electric current flows.

While certain embodiments have been described, these embodiments have been presented by way of example only, and are not intended to limit the scope of the inventions. The embodiments described herein may be embodied in a variety of other forms; furthermore, various omissions, substitutions and changes in the form of the methods and systems described herein may be made without departing from the spirit of the inventions. The embodiments and their equivalents are intended to cover such forms or modifications as would fall within the scope and spirit of the inventions.

What is claimed is:

1. A power control apparatus comprising:
acquisition circuitry configured to acquire a voltage of a secondary battery during charging; and
determination circuitry configured to:
determine a maximum current to be used during charging of the secondary battery using a difference between an upper limit voltage and the voltage,
repeatedly determine the maximum current,
determine, in a case where the difference between the upper limit voltage and the voltage is smaller than a first predetermined voltage, a value obtained by subtracting a step voltage from an immediately previous maximum current as the maximum current to be used during charging of the secondary battery,
multiply the difference between the upper limit voltage and the voltage by a first gain, that is different from a second gain to be used during discharging, to generate a multiplication result, and
determine the maximum current to be used during charging of the secondary battery using the multiplication result.

2. The power control apparatus according to claim 1, wherein the determination circuitry is configured to set the maximum current as a maximum current to be used during charging of the secondary battery in a case where the difference between the upper limit voltage and the voltage is larger than the first predetermined voltage.

3. A power control apparatus comprising:
acquisition circuitry configured to acquire a voltage of a secondary battery during discharging; and
determination circuitry configured to:
determine a maximum current to be used during discharging of the secondary battery using a difference between a lower limit voltage and the voltage,
repeatedly determine the maximum current,
determine, in a case where the difference between the lower limit voltage and the voltage is smaller than a second predetermined voltage, a value obtained by subtracting a step voltage from an immediately previous maximum current as the maximum current to be used during discharging of the secondary battery,
multiply the difference between the lower limit voltage and the voltage by a first gain, that is different from a second gain to be used during charging, to generate a multiplication result, and
determine the maximum current to be used during discharging of the secondary battery using the multiplication result.

4. The power control apparatus according to claim 3, wherein the determination circuitry is configured to set the maximum current as a maximum current to be used during discharging of the secondary battery in a case where the difference between the lower limit voltage and the voltage is larger than the second predetermined voltage.

5. The power control apparatus according to claim 3, wherein
in a case where a first gradient of a characteristic curve of the secondary battery at a first intersection between the characteristic curve and the lower limit voltage is larger than a second gradient of the characteristic curve of the secondary battery at a second intersection between the characteristic curve of the secondary battery and the lower limit voltage, the first gain to be used during charging is set to be larger than the second gain to be used during discharging, and
in a case where the first gradient is smaller than the second gradient, the first gain to be used during charging is set to be smaller than the second gain to be used during discharging.

6. The power control apparatus according to claim 3, wherein
the acquisition circuitry acquires a state of charge of the secondary battery as information relating to the voltage, and
the determination circuitry sets a voltage converted from the state of charge of the secondary battery as the voltage of the secondary battery.

7. A power control system comprising:
the power control apparatus according to claim 3; and
one or more of secondary batteries.

8. The power control apparatus according to claim 3, wherein
the acquisition circuitry acquires a state of charge of the secondary battery as information relating to the voltage, and
the determination circuitry sets a voltage converted from the state of charge of the secondary battery as the voltage of the secondary battery.

9. A power control system comprising:
the power control apparatus according to claim 3; and
one or more of secondary batteries.

* * * * *